US007570025B2

(12) United States Patent
Kim

(10) Patent No.: US 7,570,025 B2
(45) Date of Patent: *Aug. 4, 2009

(54) APPARATUS AND METHOD FOR MONITORING BATTERY PACK

(75) Inventor: Woo Choul Kim, Youngin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 401 days.

This patent is subject to a terminal disclaimer.

(21) Appl. No.: 11/291,113

(22) Filed: Nov. 29, 2005

(65) Prior Publication Data
US 2006/0139007 A1 Jun. 29, 2006

(30) Foreign Application Priority Data
Nov. 29, 2004 (KR) .................. 10-2004-0098836

(51) Int. Cl.
*H02J 7/04* (2006.01)
*H02J 7/16* (2006.01)

(52) U.S. Cl. ............... 320/150; 320/132; 320/149; 320/112

(58) Field of Classification Search ............ 320/112, 320/132, 149, 150
See application file for complete search history.

(56) References Cited

U.S. PATENT DOCUMENTS

| 5,557,188 | A | 9/1996 | Piercey | |
|---|---|---|---|---|
| 5,619,117 | A | 4/1997 | Koenck | |
| 5,783,998 | A | 7/1998 | Nakajou et al. | |
| 6,198,253 | B1 * | 3/2001 | Kurle et al. | 320/132 |
| 6,222,348 | B1 * | 4/2001 | Sato et al. | 320/149 |
| 6,437,540 | B2 * | 8/2002 | Sonobe | 320/134 |
| 2002/0036481 | A1 | 3/2002 | Nagase | |
| 2002/0093312 | A1 | 7/2002 | Choo | |
| 2003/0057918 | A1 | 3/2003 | Aoki et al. | |

FOREIGN PATENT DOCUMENTS

| JP | 8-308121 | 11/1996 |
|---|---|---|
| JP | 11-133122 | 5/1999 |

(Continued)

OTHER PUBLICATIONS

European Search Report dated May 4, 2006, for European Applicaton 06100488.3, indicating relevance of listed U.S. Publications and JP Publications 11-133122 and 2003-051341 listed in this IDS.

(Continued)

*Primary Examiner*—Adolf Berhane
*Assistant Examiner*—Yalkew Fantu
(74) *Attorney, Agent, or Firm*—Christie, Parker & Hale, LLP

(57) ABSTRACT

A battery pack monitoring apparatus for and method of monitoring various characteristics of the battery pack such that when the battery pack malfunctions, the exact reason for the malfunction can be grasped. The apparatus includes a bare cell adapted to be charged/discharged with a predetermined voltage; a voltage sensor for sensing a charging/discharging voltage of the bare cell and outputting the voltage as a predetermined electrical signal; a current sensor for sensing a charging/discharging current of the bare cell and outputting the current as a predetermined electrical signal; a control unit, a current sensor, and a data storage unit.

22 Claims, 7 Drawing Sheets

FOREIGN PATENT DOCUMENTS

| | | |
|---|---|---|
| JP | 2003-051341 | 2/2003 |
| KR | 1995-0034971 | 12/1995 |
| KR | 10-2006-0019766 | 3/2006 |

OTHER PUBLICATIONS

Patent Abstracts of Japan, Publication 11-133122, dated May 21, 1999, in the name of Hiroshi Kato et al.

Patent Abstracts of Japan, Publication 2003-051341, dated Feb. 21, 2003, in the name of Yuji Tanjo.

Korean Patent Abstracts, Publication 10-2004-0068417, dated Jul. 31, 2004, in the name of Dae Hyeon Kim (corresponds to KR 10-2006-0019766 listed above).

* cited by examiner

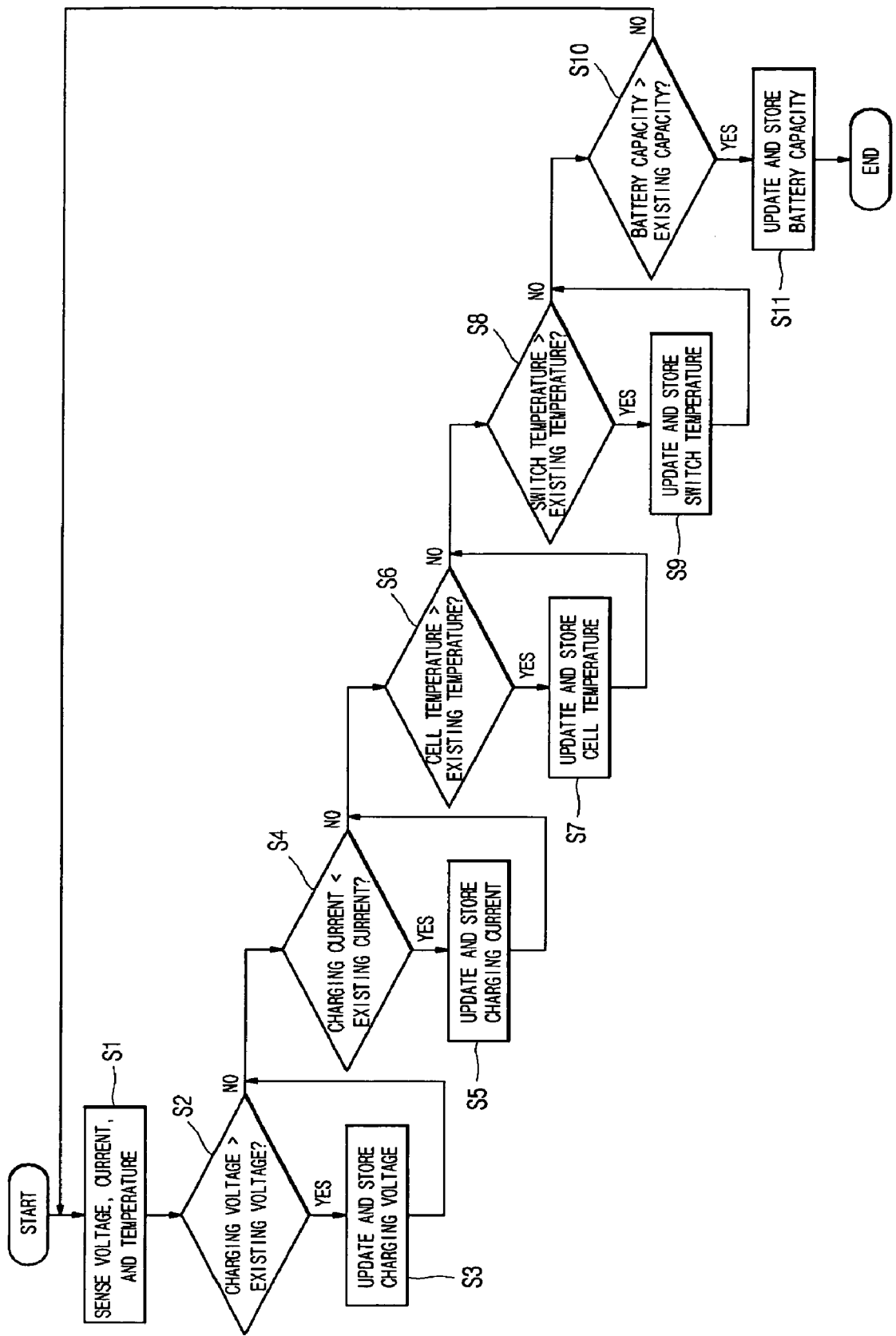

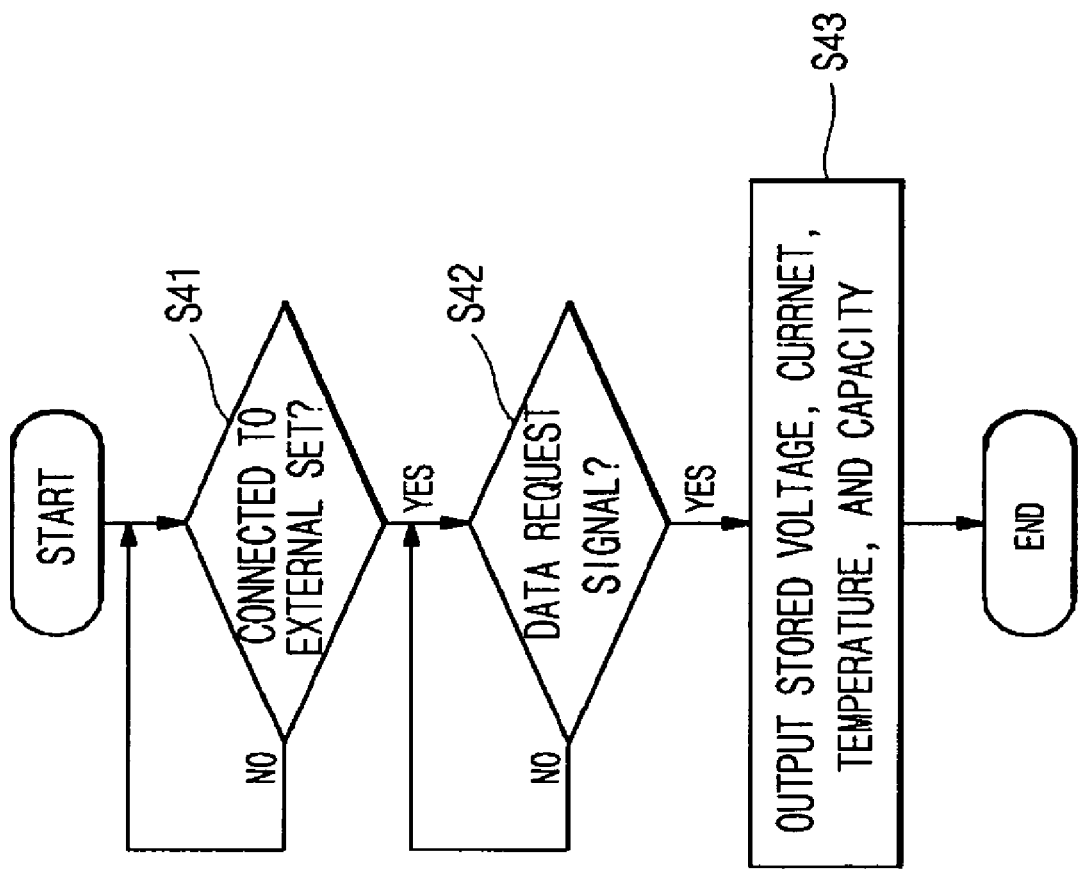

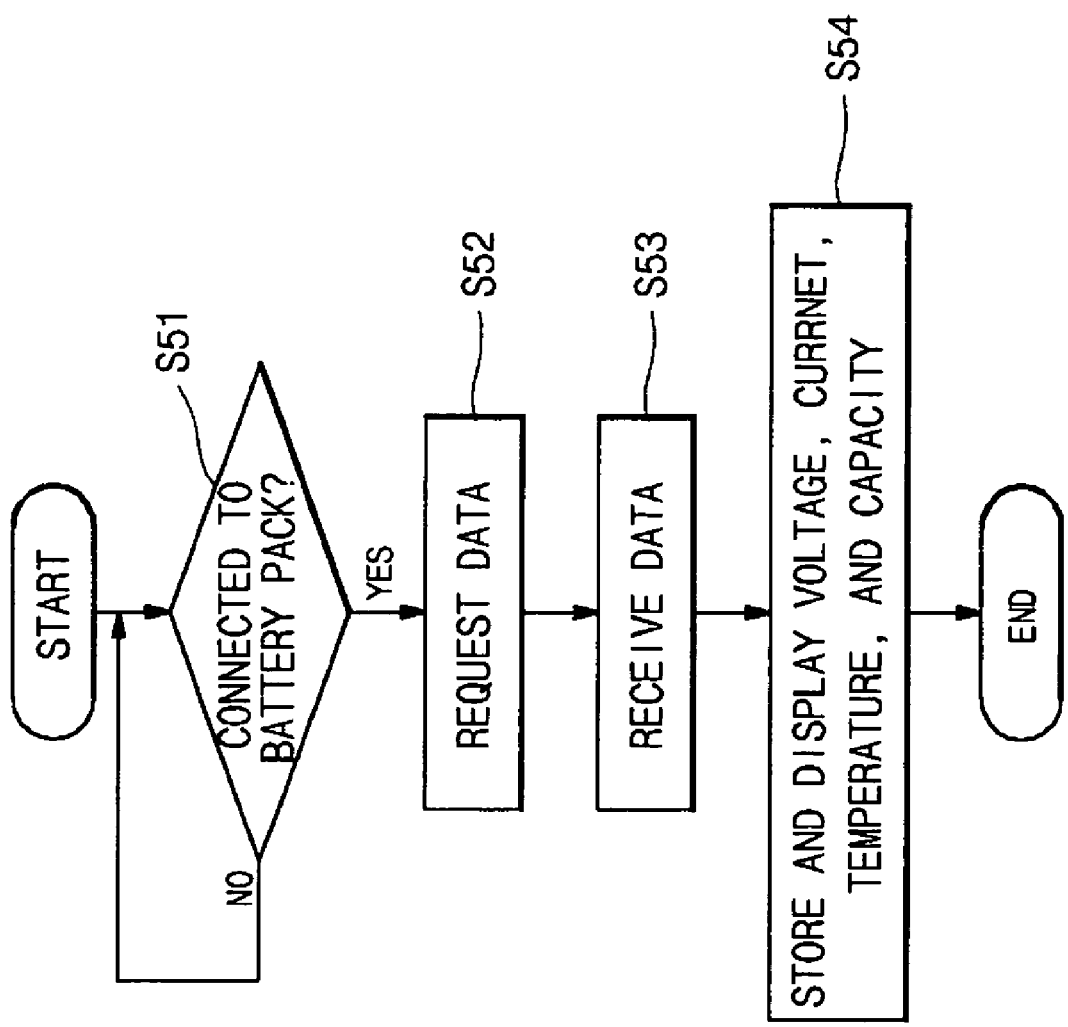

APPARATUS AND METHOD FOR MONITORING BATTERY PACK

This application claims priority to and the benefit of Korean Patent Application No. 10-2004-0098836, filed on Nov. 29, 2004, in the Korean Intellectual Property Office, the entire content of which is incorporated herein by reference.

BACKGROUND OF THE INVENTION

1. Field of the Invention

The present invention relates to a battery pack apparatus and a method of operating the battery pack. More particularly, the present invention relates to a battery pack apparatus and method for monitoring characteristics of the battery pack.

2. Description of the Related Art

In general, chargeable/dischargeable batteries (particularly, secondary batteries) undergo conversion between chemical energy and electrical energy through electrochemical reactions in which internal active materials oxidize/reduce due to charging/discharging. Secondary batteries' performances are affected by charging method, discharge depth, service temperature, external load level, number of charging/discharging, and the like.

Batteries are classified into bare cells and battery packs. The bare cells are simply adapted to be charged/discharged without any protective circuit or control circuit mounted thereon. However, battery packs have a bare cell and various circuits mounted on the bare cell and are packaged with external sets with which they are to be used.

The circuits control charging/discharging of secondary batteries and are interrupted when the batteries are overcharged/over-discharged to extend the batteries' lives and protect users from dangerous situations.

However, conventional battery packs cannot be used/maintained in an optimum condition and the exact timing for replacing them cannot be predicted accurately. Such is the case because they have no ability to separately monitor their maximum charging/discharging voltages, maximum charging/discharging currents, bare cells' temperature, charging/discharging switches' temperature, and battery capacity. However, they are able to control charging/discharging conditions and interrupt their circuits in the case of excessive voltage or current.

In addition, conventional battery packs have no ability to separately store data, such as charging/discharging voltages, charging/discharging currents, temperature, and capacity, as mentioned above, and transmit it to external sets. This makes it difficult to grasp the exact reason for a battery pack malfunction, and to periodically diagnose them.

Furthermore, conventional battery packs have no ability to provide proper warnings based on their conditions, or avoid disorder beforehand, to help ensure stable operation of external sets. Such causes the operation of external sets to be unstable.

SUMMARY OF THE INVENTION

Accordingly, the present invention has been made to address the above-mentioned problems occurring in the prior art. The present invention provides a battery pack monitoring apparatus and method of monitoring various characteristics of the battery pack such that when the battery pack malfunctions, the exact reason can be grasped.

In order to accomplish this, there is provided a battery pack monitoring apparatus including a bare cell adapted to be charged/discharged with a predetermined voltage. A voltage sensor senses a charging/discharging voltage of the bare cell and outputs the voltage as a predetermined electrical signal. A current sensor senses a charging/discharging current of the bare cell and outputs the current as a predetermined electrical signal. A control unit converts the signals inputted from the voltage sensor and the current sensor into digital signals, operates and processes the digital signals in accordance with a predetermined control command, and calculates a battery capacity with reference to the inputted voltage and current. A data storage unit stores the charging/discharging voltage, charging/discharging current, and battery capacity of the bare cell processed by the control unit.

According to another aspect of the present invention, there is provided a method for monitoring a battery pack including sensing a charging voltage, a charging current, and a temperature of a rechargeable bare cell and temperatures of charging and discharging switches at a predetermined interval when the bare cell is coupled to a charger. The method also includes storing the bare cell's charging voltage, charging current, and temperature and the charging and discharging switches' temperatures together with a battery capacity calculated beforehand.

According to another aspect of the present invention, there is provided a method for monitoring a battery pack including sensing a discharging voltage, a discharging current, and a temperature of a rechargeable bare cell and temperatures of charging and discharging switches at a predetermined interval when the bare cell is coupled to an external set. The method also includes storing the bare cell's discharging voltage, discharging current, and temperature and the charging and discharging switches' temperatures together with a battery capacity calculated beforehand.

BRIEF DESCRIPTION OF THE DRAWINGS

FIG. 2a is a flowchart showing a method for monitoring the charging of a battery pack according to an embodiment of the present invention.

FIG. 3a is a flowchart showing a series of operations of an external set, to which a battery pack is connected.

FIG. 3b is a flowchart showing a series of operations of a battery pack, to which an external set is connected.

DETAILED DESCRIPTION OF THE EMBODIMENTS

Figure 1A:
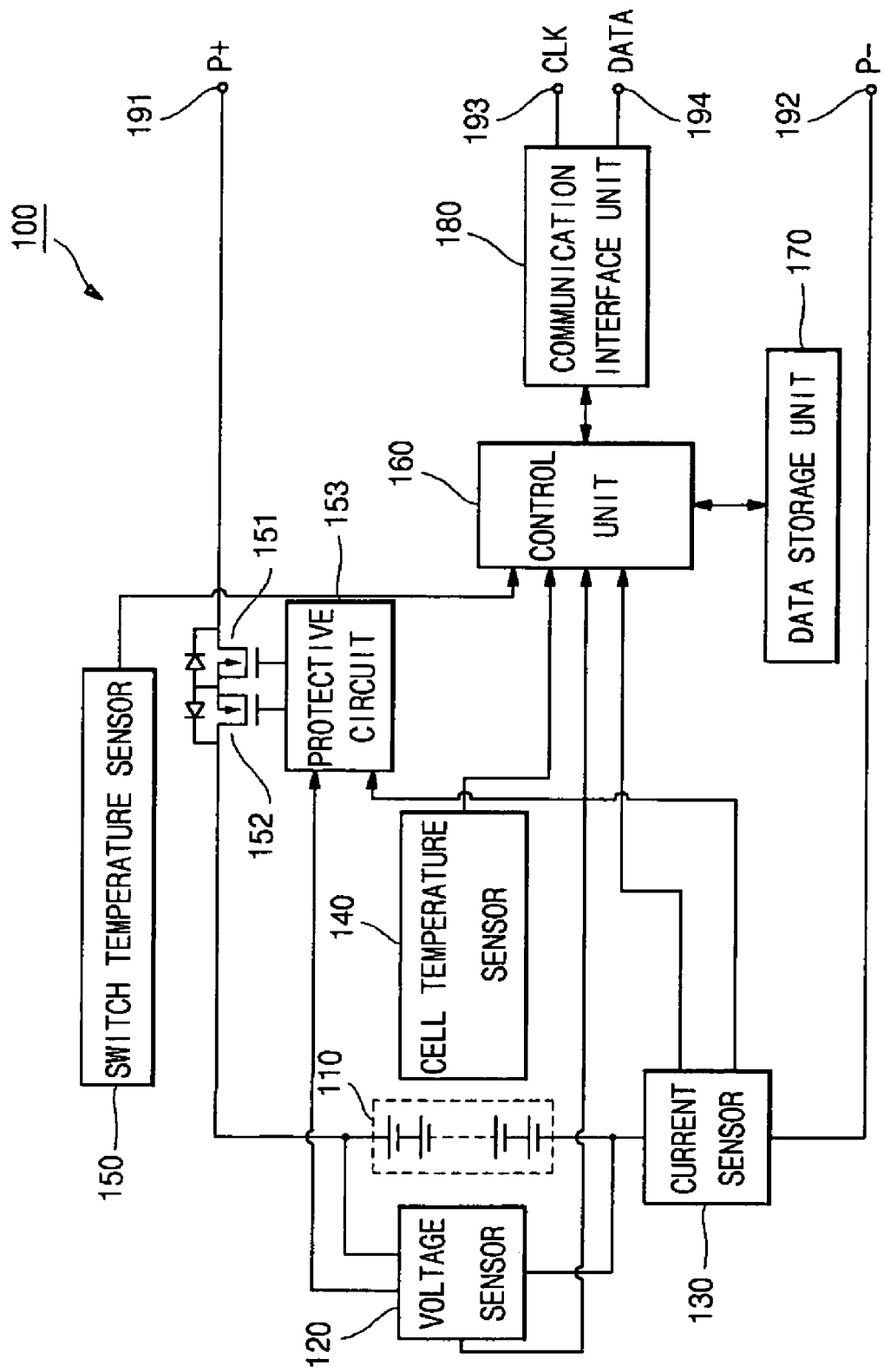
FIG. 1a is a block diagram showing a battery pack monitoring apparatus according to an embodiment of the present invention.
Figure 1B:
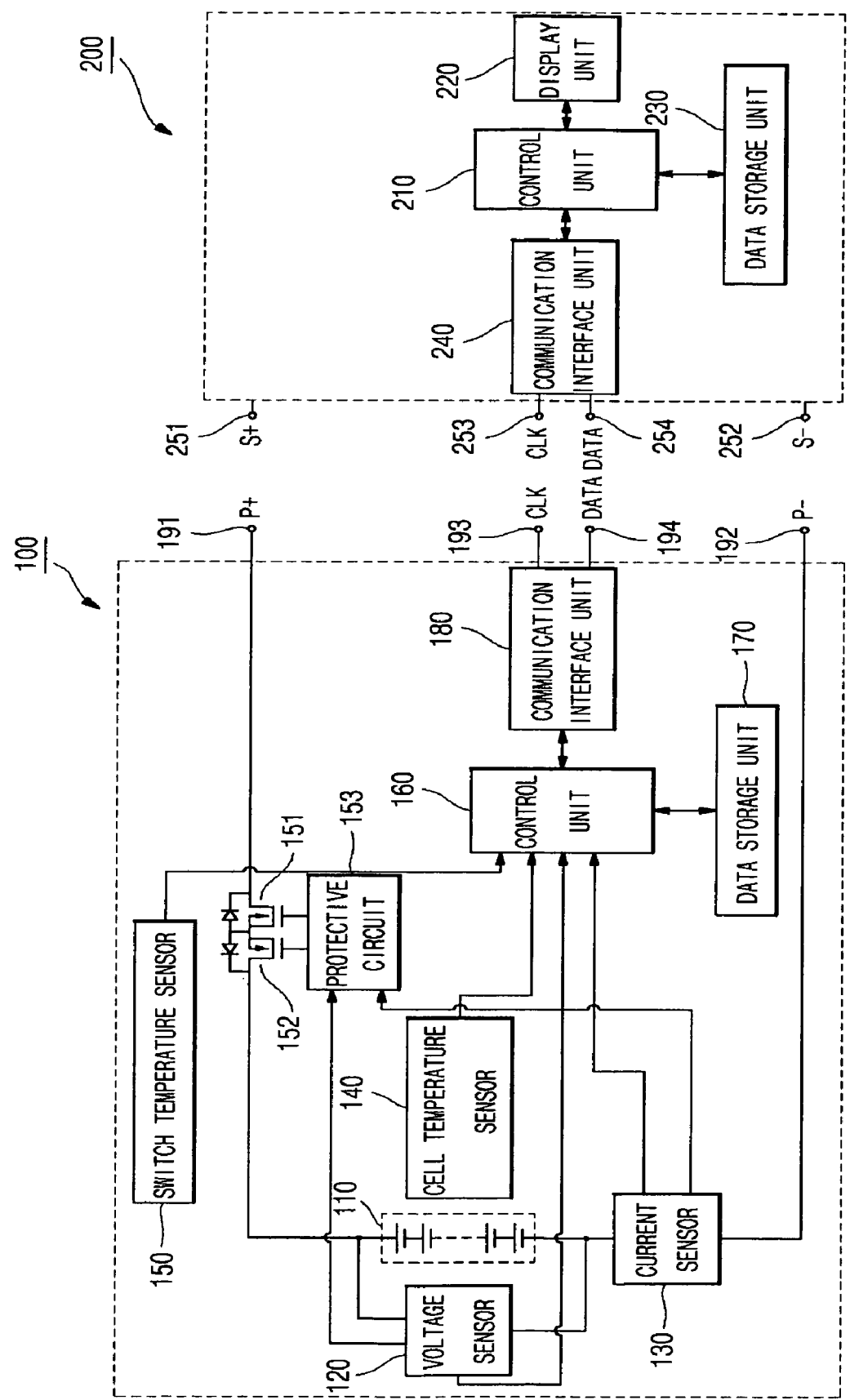
FIG. 1b is a block diagram showing a battery pack monitoring apparatus, when coupled to an external set, according to an embodiment of the present invention.

As shown in FIGS. 1a and 1b, a battery pack monitoring apparatus 100 according to an embodiment of the present invention includes a bare cell 110, a voltage sensor 120, a current sensor 130, a cell temperature sensor 140, a switch temperature sensor 150, a control unit 160, a data storage unit 170, and a communication interface unit 180.

At least one bare cell 110 is coupled in series and/or in parallel and is adapted to be charged or discharged with a predetermined voltage. The bare cell 110 is coupled to external terminals 191 and 192. Referring to FIG. 1*b*, a charger (not shown) or an external set 200 is coupled to the external terminals 191 and 192. The bare cell 110 may be any type of secondary battery. For example, the bare cell 110 may be a lithium ion battery, a lithium polymer battery, or a fuel cell.

The voltage sensor 120 is coupled in parallel to the bare cell 110 to sense a charging voltage, when the bare cell 110 is charged, or a discharging voltage, when the bare cell 110 is discharged. The sensed voltage is converted into an electrical signal and outputted to the control unit 160.

The current sensor 130 is coupled in series to a large-current path between the bare cell 110 and the external terminal 192 to sense a charging current, when the bare cell 110 is charged, or a discharging current, when the bare cell 110 is discharged. The sensed voltage is converted into an electrical signal and outputted to the control unit 160.

The cell temperature sensor 140 is positioned adjacent to the bare cell 110 to sense temperature when the bare cell 110 is charged/discharged. The sensed temperature is converted into an electrical signal and is outputted to the control unit 160. The cell temperature sensor 140 may include but is not limited to a thermistor, a winding resistor-type sensor, a wide area resistance sensor, a semiconductor diode sensor, a medal core-type sensor, a thermocouple, or an equivalent thereof.

The switch temperature sensor 150 is positioned on top of charging and discharging switches 151 and 152 for controlling charging/discharging in the large-current path. The switch temperature sensor 150 senses surface temperatures of the charging and discharging switches 151 and 152 when the bare cell 150 is charged/discharged. The sensed surface temperatures are converted into electrical signals and outputted to the control unit 160. The charging and discharging switches 151 and 152 are coupled in series to the large-current path between the bare cell 110 and the external terminal 191. By way of example, the charging and discharging switches 151 and 152 may be FETs, the gate voltage of which is controlled by a separate protective circuit 153. The protective circuit 153 may receive input of information on voltages and currents from the voltage and current sensors 120 and 130, respectively, when the bare cell 110 is charged/discharged. The protective circuit 153 may toggle off the charging switch 151 during charging, when the bare cell is overcharged, or toggle off the discharging switch 152 during discharging, when the bare cell 110 is over-discharged. In this manner, the bare cell 110 can be protected from overcharging or over-discharging.

The control unit 160 converts signals inputted from the voltage sensor 120, the current sensor 130, the cell temperature sensor 140, and the switch temperature sensor 150 into digital signals and processes the converted digital data according to a predetermined control command. For example, the control unit 160 calculates the battery's capacity or service time using information on voltages, currents, and temperatures obtained from the sensors.

The data storage unit 170 stores data related to the bare cell 110, including its charging/discharging voltages, charging/discharging currents, temperature, switch temperature, and battery capacity, which has been processed by the control unit 160. Particularly, the data storage unit 170 may update existing data including highest or lowest charging/discharging voltages, highest or lowest charging/discharging currents, a highest or lowest cell temperature, a highest or lowest switch temperature, and a highest or lowest battery capacity and store it.

More particularly, when the bare cell 110 is charged with a charging voltage larger than an existing charging voltage, a charging current smaller than an existing charging current, a bare cell temperature larger or smaller than an existing bare cell temperature, a switch temperature larger or smaller than an existing switch temperature, and a battery capacity larger than an existing battery capacity, the data storage unit 170 may update these values and store them. As the charging voltage of the bare cell 110 approaches a fully charged level, the charger may control it in such a manner that it no longer increases, while the charging current gradually decreases. When the bare cell 110 is discharged with a discharging voltage smaller than an existing discharging voltage, a discharging current larger than an existing discharging current, a bare cell temperature larger or smaller than an existing bare cell temperature, a switch temperature larger or smaller than an existing switch temperature, and a battery capacity smaller than an existing battery capacity, the data storage unit 170 may update these values and store them. The discharging voltage of the bare cell 110 gradually decreases as discharging time elapses, while the discharging current gradually increases, so that the total amount of power remains the same.

The data storage unit 170 may include but is not limited to a conventional EEPROM, a flash memory, or an equivalent thereof.

The communication interface unit 180 is coupled to the control unit 160 to transmit data from the data storage unit 170 to the external set 200 or transmit signals from the external set 200 to the control unit 160. The communication interface unit 180 may adopt conventional RS-232C (Recommended Standard 232 Revision C) mode including a UART chip to convert parallel data outputted from the control unit 160 into serial bits, but the mode is not limited to that in the present embodiments of the invention. The communication interface unit 180 may have a clock terminal 193 and a data terminal 194 to be coupled to the external set 200.

The external set 200 may include a control unit 210, a display unit 220, a data storage unit 230, and a communication interface unit 240. The communication interface unit 240 may have a clock terminal 253 and a data terminal 254 to communicate with the battery pack monitoring apparatus 100, as well as external terminals 251 and 252 to be supplied with power.

The control unit 210 outputs a control signal to the battery pack monitoring apparatus 100 via the communication interface unit 240 or receives signals from the battery pack monitoring apparatus 100 via the communication interface unit 240 for control and processing.

The display unit 220 may display various information on the battery pack monitoring apparatus 100 transmitted via the communication interface unit 240, for example, the voltage, current, and temperature of the bare cell 110, the temperature of the charging and discharging switches 151 and 152, the battery capacity, and the like.

The storage unit 230 may store various information on the battery pack monitoring apparatus 100 transmitted via the communication interface unit 240, for example, the voltage, current, and temperature of the bare cell 110, the temperature of the charging and discharging switches 151 and 152, the battery capacity, and the like. The storage unit 230 may include but is not limited to a conventional EPROM, flash memory, hard disk, diskette, CD, DVD, or an equivalent thereof.

The communication interface unit 240 is coupled to the control unit 210 to output a data request signal to the battery pack monitoring apparatus 100 and transmit various data from the battery pack monitoring apparatus 100 to the control unit 210. The communication interface unit 240 may adopt conventional RS-232C mode including a UART chip to convert parallel data outputted from the control unit 210 into serial bits, but the mode is not limited to that in the present invention.

Charging monitoring and discharging monitoring can be performed simultaneously. However, they will now be described separately for convenience of description.

As shown in FIG. 2a, a method for monitoring the charging condition of a chargeable battery cell according to an embodiment of the present invention includes sensing (S1) the battery cell's charging voltage, charging current, and temperature, as well as charging and discharging switches' temperature at a predetermined interval, when the bare cell is coupled to a charger. The method may also include updating (S3) an existing charging voltage into a sensed charging voltage, when the sensed charging voltage is larger than the existing charging voltage (S2), and storing the sensed charging voltage (S3). The method may also include updating (S5) an existing charging current into a sensed charging current, when the sensed charging current is smaller than the existing charging current (S4), and storing the charging current (S5). The method may also include updating (S7) an existing bare cell temperature into a sensed bare cell temperature, when the sensed bare cell temperature is higher (or lower) than the existing bare cell temperature (S6), and storing the bare cell temperature (S7). The method may also include updating (S9) the charging and discharging switches' existing temperatures into their sensed temperatures, when the sensed temperatures are higher (or lower) than the existing temperatures (S8), and storing the switch temperatures (S9). The method may also include updating (S11) an existing battery capacity into a newly-calculated battery capacity, when the battery capacity newly calculated based on the charging voltage, current, and temperatures is larger than the existing battery capacity (S10), and storing the battery capacity (S11).

Figure 2B:
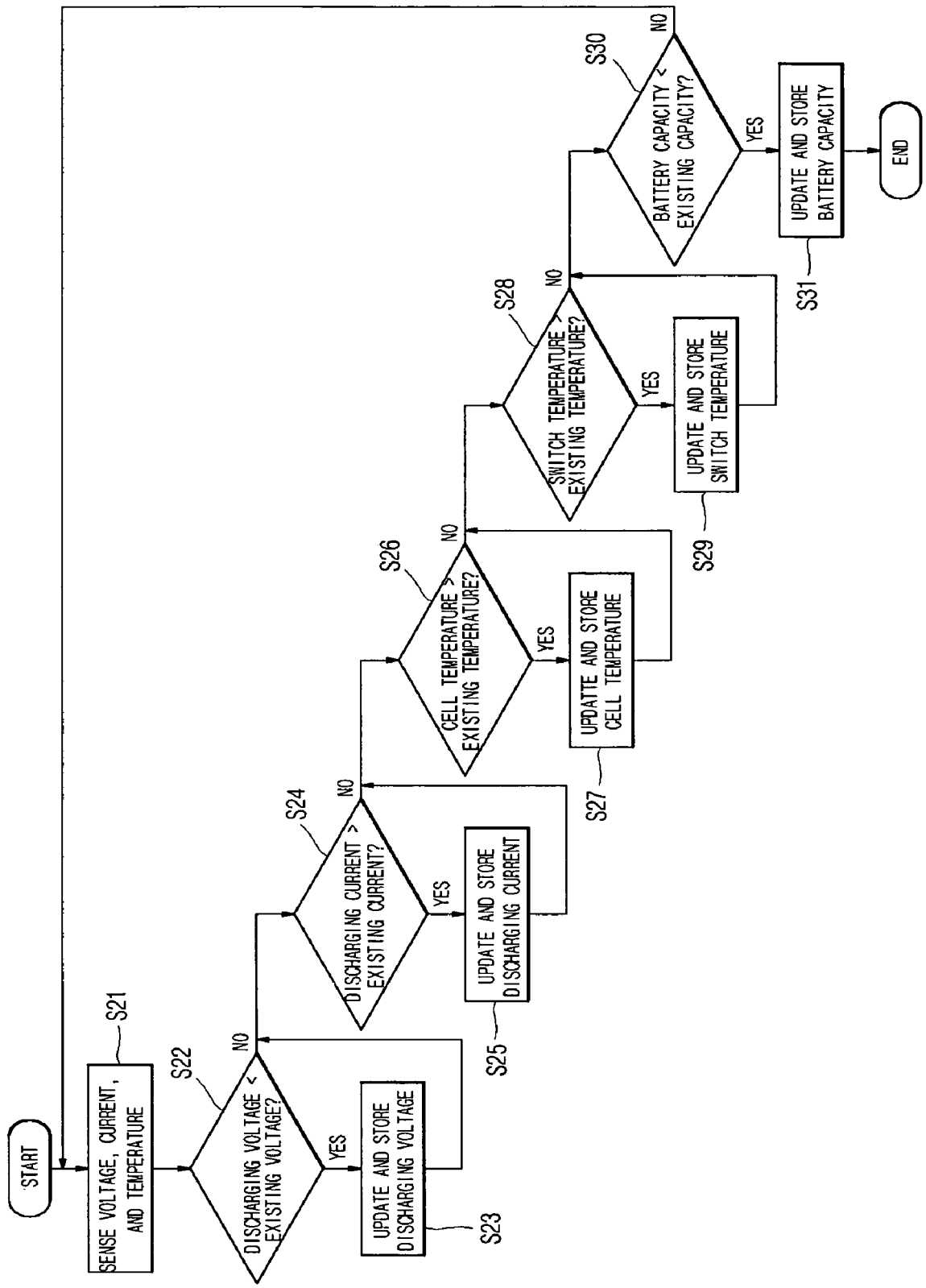
FIG. 2b is a flowchart showing a method for monitoring the discharging of a battery pack according to an embodiment of the present invention.

As shown in FIG. 2b, a method for monitoring the discharging condition of a dischargeable battery cell according to an embodiment of the present invention may include sensing (S21) the battery cell's discharging voltage, discharging current, and temperature, as well as charging and discharging switches' temperature at a predetermined interval, when the bare cell is coupled to an external set; and updating (S23) an existing discharging voltage into a sensed discharging voltage, when the sensed discharging voltage is smaller than the existing discharging voltage (S22), and storing the discharging voltage (S23). The method may also include updating (S25) an existing discharging current into a sensed discharging current, when the sensed discharging current is larger than the existing discharging current (S24), and storing the discharging current (S25). The method may also include updating (S27) an existing bare cell temperature into a sensed bare cell temperature, when the sensed bare cell temperature is higher (or lower) than the existing bare cell temperature (S26), and storing the cell temperature (S27). The method may also include updating (S29) the charging and discharging switches' existing temperatures into their sensed temperatures, when the sensed temperatures are higher (or lower) than the existing temperatures (S28), and storing the switch temperatures (S29). The method may also include updating (S31) an existing battery capacity into a newly-calculated battery capacity, when the battery capacity newly calculated based on the discharging voltage, current, and temperatures is smaller than the existing battery capacity (S30), and storing the battery capacity (S31).

As shown in FIG. 3a, a method for performing communication between a battery pack monitoring apparatus and an external set according to an embodiment of the present invention may include: deciding (S41) whether or not the external set has been coupled to a battery pack; deciding (S42) whether or not there is a data request from the external set, when it is confirmed that the external set has been coupled to the battery pack; and converting a bare cell's charging/discharging voltages, charging/discharging currents, and temperature, charging and discharging switches' temperature, and a battery capacity, which have been sensed beforehand, into electrical signals and outputting (S43) them, when it is confirmed that there is a data request.

As shown in FIG. 3b, a method for performing communication between a battery pack monitoring apparatus and an external set according to an embodiment of the present invention may include: deciding (S51) whether or not a battery pack has been coupled to the external set; requesting (S52) data transmission from the battery pack when it is confirmed that the battery pack has been coupled to the external set; receiving (S53) information on a bare cell of the battery pack, including its charging/discharging voltages, charging/discharging currents, and temperature, charging and discharging switches' temperature, and a battery capacity; and displaying (S54) the received information on the bare cell, including its charging/discharging voltages, charging/discharging currents, and temperature, the charging and discharging switches' temperature, and the battery capacity, via a display unit and storing (S54) it on a storage unit.

Figure 4A:
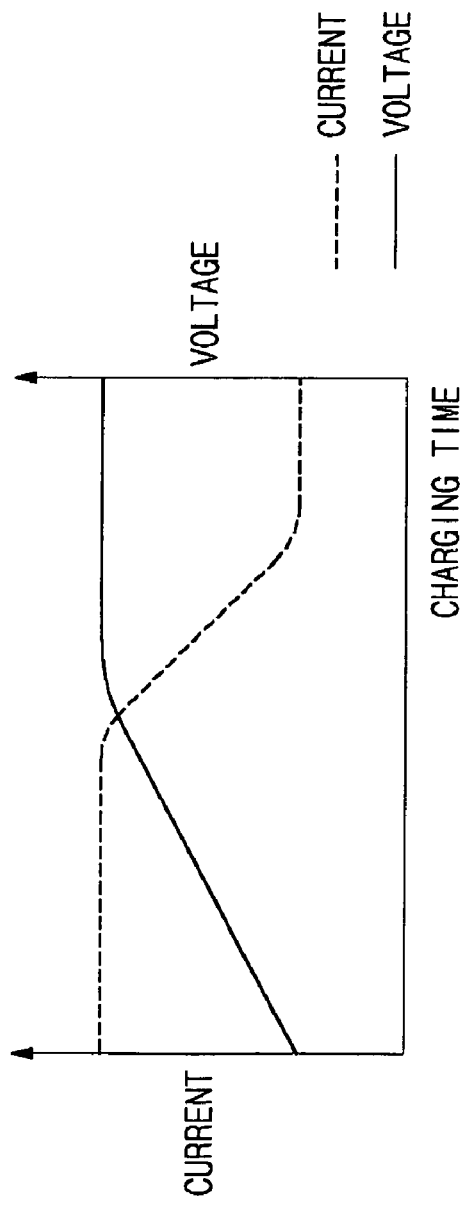
FIG. 4a is a graph showing the relationship between charging voltages and charging currents during charging as charging time elapses.

As shown in FIG. 4a, when a battery pack is charged, the charging voltage generally increases up to a predetermined level as charging time elapses and, after that, remains constant. In contrast, the charging current gradually decreases. This behavior may be controlled by a charger.

Figure 4B:
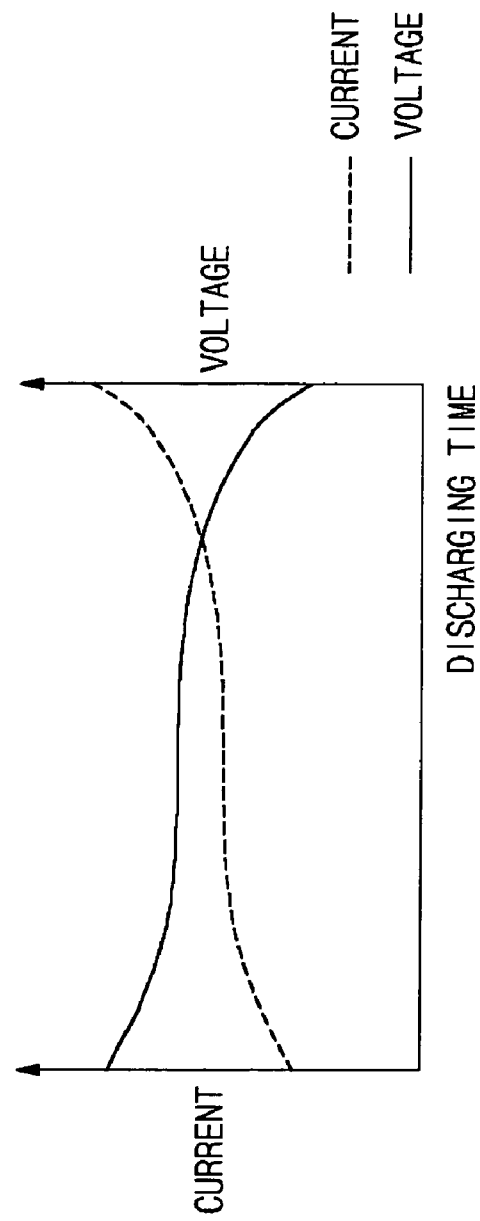
FIG. 4b is a graph showing the relationship between discharging voltages and discharging currents during discharging as discharging time elapses.

As shown in FIG. 4b, when a battery pack is discharged, the discharging voltage generally decreases as discharging time elapses so that the total amount of power remains the same. In contrast, the discharging current gradually increases.

The operation of the above-mentioned apparatus and method for monitoring a battery pack according to an embodiment of the present invention will now be described.

The battery pack monitoring apparatus according to an embodiment of the present invention may operate while the battery pack is simultaneously coupled to the charger and the external set. However, for convenience of understanding and description, a case in which the battery pack is coupled to the charger and another case in which the battery pack is coupled to the external set will be separately described.

Referring to FIGS. 1a, 2a and 4a, when the battery pack is coupled to the charger, a current flows through the positive external terminal 191, the charging and discharging switches 151 and 152, the bare cell 110, the voltage sensor 120, and the current sensor 130 to the negative external terminal 192.

The voltage sensor 120 senses the charging voltage with which the bare cell 110 is charged, the current sensor 130 senses the charging current flowing through the bare cell 110, the cell temperature sensor 140 senses the temperature of the bare cell 110, and the switch temperature sensor 150 senses the temperature of the charging and discharging switches 151 and 152 (S1). This sensing process may be updated and performed every 10-30 minutes.

All analog signals sensed in this manner are inputted to the control unit 160. Then, the analog signals are converted into digital signals by an analog/digital converter (positioned inside the control unit) and processed in accordance with a predetermined control command.

Thereafter, it is decided whether or not the charging voltage sensed in S1 is larger than an existing charging voltage, which has been stored on the data storage unit 170 (S2).

When it is confirmed after the decision that a newly-sensed charging voltage is larger than the existing charging voltage, the newly-sensed charging voltage is updated into a new highest charging voltage and stored on the data storage unit 170 (S3).

When it is confirmed that the sensed charging voltage is not larger than the existing charging voltage, or after updating it into a new highest charging voltage and storing it on the data storage unit 170 (S2, S3), it is decided whether or not the charging current sensed in S1 is smaller than an existing charging current, which has already been stored on the data storage unit 170 (S4).

When it is confirmed after the decision that a newly-sensed charging current is smaller than the existing charging current, the newly-sensed charging current is updated into a new lowest charging current and stored on the data storage unit 170 (S5). The reason the lowest charging current is updated and stored is that the degree of progress of charging must be determined, because the charging current gradually decreases as charging time elapses (refer to FIG. 4a).

When it is confirmed that the sensed charging current is not smaller than the existing charging current, or after updating it into a new lowest charging current and storing it on the data storage unit 170 (S4, S5), it is decided whether or not the cell temperature of the bare cell 110 sensed in S1 is higher than an existing cell temperature, which has already been stored on the data storage unit 170 (S6).

When it is confirmed after the decision that a newly-sensed cell temperature is higher than the existing cell temperature, the newly-sensed cell temperature is updated into a new highest cell temperature and stored on the data storage unit 170 (S7). When the cell temperature is lower than the existing cell temperature, in contrast, the cell temperature may be updated into the smaller value and stored on the storage unit 170.

When it is confirmed that the sensed cell temperature is not higher than the existing cell temperature, or after updating it into a new highest cell temperature and storing it on the data storage unit 170 (S6, S7), it is decided whether or not the temperature of the charging and discharging switches 151 and 152 sensed in S1 is higher than an existing switch temperature, which has already been stored on the data storage unit 170 (S8).

When it is confirmed after the decision that a newly-sensed switch temperature is higher than the existing switch temperature, the newly-sensed switch temperature is updated into a new highest switch temperature and stored on the data storage unit 170 (S9). When switch temperature is lower than the existing switch temperature, in contrast, the switch temperature may be updated into the lower value and stored on the storage unit 170.

A battery capacity is calculated while making overall reference to the bare cell's charging voltage, charging current, temperature, and switch temperature, which have been sensed as noted in the above method, and it is decided whether or not the battery capacity is larger than an existing battery capacity (S10). For the sake of this calculation, the relationship of the battery capacity with the charging voltage, charging current, and temperature has already been tabularized and stored in the storage unit 170.

When it is confirmed after the decision that a newly-calculated battery capacity is larger than the existing battery capacity, the newly-calculated battery capacity is updated into a highest capacity and stored on the data storage unit 170 (S11).

The order of the above method, including the order of performing S2, S3, performing S4, S5, performing S6, S7, performing S8, S9, and performing S10, S11 may be modified as desired, and is not limited to only those embodiments described herein.

Referring to FIGS. 1b, 2b and 4b, when the battery pack is coupled to the external set, a current flows through a positive electrode of the bare cell 110, the charging and discharging switches 151 and 152, the external terminal 191, the external set, the external terminal 192, and the current sensor 130 to a negative electrode of the bare cell 110 and the voltage sensor 120.

The voltage sensor 120 senses the discharging voltage of the bare cell 110, the current sensor 130 senses the discharging current of the bare cell 110, the cell temperature sensor 140 senses the temperature of the bare cell 110, and the switch temperature sensor 150 senses the temperature of the charging and discharging switches 151 and 152 (S21). This sensing process may be updated and performed every 10-30 minutes.

All analog signals sensed in this manner are inputted to the control unit 160. Then, the analog signals are converted into digital signals by an analog/digital converter (positioned inside the control unit) and processed in accordance with a predetermined control command.

Thereafter, it is decided whether or not the discharging voltage sensed in S21 is smaller than an existing discharging voltage, which has been stored on the data storage unit 170 (S22).

When it is confirmed after the decision that a newly-sensed discharging voltage is smaller than the existing discharging voltage, the newly-sensed discharging voltage is updated into a new lowest discharging voltage and stored on the data storage unit 170 (S23).

When it is confirmed that the sensed discharging voltage is not smaller than the existing discharging voltage, or after updating it into a new lowest discharging voltage and storing it on the data storage unit 170 (S22, S23), it is decided whether or not the discharging current sensed in S21 is larger than an existing discharging current, which has been already stored on the data storage unit 170 (S24).

When it is confirmed after the decision that a newly-sensed discharging current is larger than the existing discharging current, the newly-sensed discharging current is updated into a new highest discharging current and stored on the data storage unit 170 (S25). The reason the highest discharging current is updated and stored is that the degree of progress of discharging must be determined, because the discharging current gradually increases as discharging time elapses (refer to FIG. 4b).

When it is confirmed that the sensed discharging current is not larger than the existing discharging current, or after updating it into a new highest discharging current and storing it on the data storage unit 170 (S24, S25), it is decided whether or not the cell temperature of the bare cell 110 sensed in S21 is higher than an existing cell temperature, which has already been stored on the data storage unit 170 (S26).

When it is confirmed after the decision that a newly-sensed cell temperature is higher than the existing cell temperature, the newly-sensed cell temperature is updated into a new highest cell temperature and stored on the data storage unit 170 (S27). When the cell temperature is lower than the existing cell temperature, in contrast, the cell temperature may be updated into the smaller value and stored on the storage unit 170.

When it is confirmed that the sensed cell temperature is not higher than the existing cell temperature, or after updating it into a new highest cell temperature and storing it on the data storage unit 170 (S26, S27), it is decided whether or not the temperature of the charging and discharging switches 151 and 152 sensed in S21 is higher than an existing switch temperature, which has been stored on the data storage unit 170 (S28).

When it is confirmed after the decision that a newly-sensed switch temperature is higher than the existing switch temperature, the newly-sensed switch temperature is updated into a new highest switch temperature and stored on the data storage unit 170 (S29). When switch temperature is lower than the existing switch temperature, in contrast, the switch temperature may be updated into the lower value and stored on the storage unit 170.

A battery capacity is calculated while making reference to the bare cell's discharging voltage, discharging current, temperature, and switch temperature, which have been sensed in the above method, and it is decided whether or not the battery capacity is larger than an existing battery capacity (S30).

When it is confirmed after the decision that a newly-calculated battery capacity is smaller than the existing battery capacity, the newly-calculated battery capacity is updated into a lowest capacity and stored on the data storage unit 170 (S31). For the sake of calculating the battery capacity, the relationship of the battery capacity with the discharging voltage, discharging current, and temperature has already been tabularized and stored in the storage unit 170.

The order of the above method including performing S22, S23, performing S24, S25, performing S26, S27, performing S28, S29, and performing S30, S31 may be modified as desired, and is not limited to only those embodiments described herein.

Through the communication interface unit 180, data stored on the data storage unit 170, including the highest or lowest charging/discharging voltage, the highest or lowest charging/discharging current, the highest or lowest cell temperature, the highest or lowest switch temperature, and the highest or lowest battery capacity, is transmitted to the external set 200 as predetermined signals. Particularly, data is transmitted to another data storage unit 230 on the external set 200 via the data terminal 194. This makes it possible to easily monitor various information on the battery pack with the external set 200 and operate the external set 200 safety. When the battery pack malfunctions, the reason can be traced by checking the battery pack's charging/discharging voltages, currents, cell temperatures, switch temperatures, and battery capacity, which are recorded on the external set.

As mentioned above, the apparatus and method for monitoring a battery pack according to an embodiment of the present invention are advantageous in that the battery pack's charging voltage, charging current, discharging voltage, discharging current, cell temperature, switch temperature, and battery capacity are monitored to maintain and use the battery pack in an optimum condition. In addition, the exact timing for replacing the battery pack can be predicted.

The charging voltage, charging current, discharging voltage, discharging current, cell temperature, switch temperature, and battery capacity may be stored on the apparatus' own memory or transmitted to an eternal set so that, when the battery pack malfunctions, the reason can be traced accurately.

The battery pack's condition can always be monitored with the external set for easier diagnosis of the battery pack.

The external set may incorporate a program having a function of providing an alarm depending on the battery packs condition for safer operation of the external set.

Although an embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A battery pack monitoring apparatus comprising:
a bare cell adapted to be charged or discharged with a voltage;
a voltage sensor adapted to sense a charging voltage or a discharging voltage of the bare cell and output a sensed charging voltage or a sensed discharging voltage as a first electrical signal;
a current sensor adapted to sense a charging current or a discharging current of the bare cell and output a sensed charging current or a sensed discharging current as a second electrical signal;
a charging switch and a discharging switch coupled between the bare cell and an external terminal;
a switch temperature sensor near the charging switch and the discharging switch, the switch temperature sensor adapted to sense a temperature of the charging switch or the discharging switch, and convert the sensed temperature into a third electrical signal;
a control unit adapted to convert the first electrical signal, the second electrical signal, and the third electrical signal into a respective first digital signal, second digital signal and a third digital signal, operate and process the first digital signal, the second digital signal and the third digital signal in accordance with a control command, and calculate a battery capacity with reference to the first electrical signal, the second electrical signal and the third electrical signal; and
a data storage unit adapted to store sensed charging voltage data or sensed discharging voltage data, sensed charging current data or sensed discharging current data, sensed temperature data of the charging switch or the discharging switch and calculated battery capacity data of the bare cell processed by the control unit.

2. The battery pack monitoring apparatus as claimed in claim 1, further comprising a cell temperature sensor near the bare cell to sense a temperature of the bare cell, convert the temperature of the bare cell into a fourth electrical signal, and output the fourth electrical signal to the control unit.

3. The battery pack monitoring apparatus as claimed in claim 2, wherein the control unit is adapted to calculate the battery capacity with reference to the sensed temperature of the bare cell.

4. The battery pack monitoring apparatus as claimed in claim 1, wherein the control unit is adapted to update and store the sensed charging voltage data when the sensed charging voltage is larger than an existing charging voltage.

5. The battery pack monitoring apparatus as claimed in claim 1, wherein the control unit is adapted to update and store the sensed discharging voltage data when the sensed discharging voltage is smaller than an existing discharging voltage.

6. The battery pack monitoring apparatus as claimed in claim 2, wherein the control unit is adapted to update and store the sensed temperature data of the bare cell when the sensed temperature of the bare cell is higher than an existing cell temperature.

7. The battery pack monitoring apparatus as claimed in claim 1, wherein the charging switch or the discharging switch is coupled to at least one protective circuit to toggle on/off the charging switch or the discharging switch in accordance with an input of the first electrical signal from the voltage sensor or the second electrical signal from the current sensor.

8. The battery pack monitoring apparatus as claimed in claim 1, wherein the control unit is coupled to a communication interface unit, and wherein the communication interface unit is adapted to transmit the sensed charging voltage data or the sensed discharging voltage data, the sensed charging current data or the sensed discharging current data, the sensed temperature data of the charging switch or the discharging switch and the calculated battery capacity data of the bare cell processed by the control unit.

9. The battery pack monitoring apparatus as claimed in claim 8, wherein the communication interface unit adopts a RS-232C (Recommended Standard 232 Revision C) mode.

10. The battery pack monitoring apparatus as claimed in claim 2, wherein the cell temperature sensor is selected from the group consisting of: a thermistor, a winding resistor-type sensor, a wide area resistance sensor, a semiconductor diode sensor, a medal core-type sensor, and a thermocouple.

11. The battery pack monitoring apparatus as claimed in claim 8, wherein the communication interface unit is coupled to an external set, wherein the external set comprises:
- a set communication interface unit coupled to the communication interface unit of the battery pack;
- a set control unit adapted to process signals inputted from the set communication interface unit; and
- a set data storage unit adapted to store data regarding the battery pack under control of the set control unit, the data including the charging voltage data or the discharging voltage data, charging current data or discharging current data, the bare cell temperature data, the temperature data of the charging switch or the discharging switch, and the battery capacity.

12. The battery pack monitoring apparatus as claimed in claim 11,
wherein the set control unit has a set display unit coupled thereto to display the data regarding the battery pack stored on the set data storage unit.

13. A method for monitoring a battery pack comprising:
sensing a charging voltage of a bare cell and outputting a sensed charging voltage signal;
sensing a charging current of the bare cell and outputting a sensed charging current signal;
sensing a temperature of the bare cell and outputting a sensed temperature of the bare cell signal;
sensing a temperature of a charging switch or a discharging switch and outputting a sensed temperature of the charging switch or the discharging switch signal at an interval when the bare cell is charged or discharged; and
storing sensed charging voltage data, sensed charging current data, sensed temperature data of the bare cell and sensed temperature data of the charging switch or the discharging switch together with a calculated battery capacity data.

14. The method as claimed in claim 13, wherein storing comprises:
updating existing charging voltage data to the sensed charging voltage data when the sensed charging voltage is larger than an existing charging voltage, and storing the sensed charging voltage data;
updating existing charging current data to the sensed charging current data when the sensed charging current is smaller than an existing charging current, and storing the sensed charging current data;
updating existing bare cell temperature data to the sensed bare cell temperature data when the sensed bare cell temperature is higher than an existing bare cell temperature, and storing the sensed bare cell temperature data;
updating existing temperature data of the charging switch or the discharging switch to the sensed temperature data of the charging switch or the discharging switch when the sensed temperature of the charging switch or the discharging switch is higher than an existing temperature of the charging switch or the discharging switch, and storing the sensed temperature data of the charging switch or the discharging switch; and
updating existing battery capacity data to the calculated battery capacity data when the calculated battery capacity is larger than an existing battery capacity, and storing the calculated battery capacity data.

15. The method as claimed in claim 13, wherein the interval is approximately 10-30 minutes.

16. The method as claimed in claim 13, further comprising transmitting the charging voltage data, the charging current data, the temperature data of the charging switch or the discharging switch, and the battery capacity data to and from an external set.

17. A method for monitoring a battery pack comprising:
sensing a discharging voltage of a bare cell and outputting a sensed discharging voltage signal,
sensing a discharging current of the bare cell and outputting a sensed discharging current signal;
sensing a temperature of the bare cell and outputting a sensed temperature signal;
sensing a temperature of a charging switch or a discharging switch at an interval when the bare cell is coupled to an external set and outputting a sensed temperature of a charging switch or a discharging switch signal; and
storing sensed discharging voltage data of the bare cell, sensed discharging current data, sensed temperature data of the bare cell, sensed temperature data of the charging switch or the discharging switch and previously-calculated battery capacity data.

18. The method as claimed in claim 17, wherein storing comprises:
updating existing discharging voltage data to the sensed discharging voltage data when the sensed discharging voltage is smaller than an existing discharging voltage, and storing the sensed discharging voltage data;
updating existing discharging current data to the sensed discharging current data when the sensed discharging current is larger than an existing discharging current, and storing the sensed discharging current data;
updating existing bare cell temperature data to the sensed bare cell temperature data when the sensed bare cell temperature is higher than an existing bare cell temperature, and storing the sensed bare cell temperature data;
updating existing temperature data of the charging switch or the discharging switch to the sensed temperature data of the charging switch or the discharging switch, when the sensed temperature of the charging switch or the discharging switch is higher than an existing temperature of the charging switch or the discharging switch, and storing the sensed temperature data of the charging switch or the discharging switch; and
updating existing battery capacity data to the calculated battery capacity data when a calculated battery capacity is smaller than an existing battery capacity, and storing the calculated battery capacity data.

19. The method as claimed in claim 17, further comprising transmitting the discharging voltage data of the bare cell, the discharging current data, the temperature data of the charging or discharging switch, and the battery capacity data to and from the external set.

20. The battery pack monitoring apparatus as claimed in claim 2, wherein the control unit is adapted to update and store the sensed charging current data when the sensed charging current is smaller than an existing charging current.

21. The battery pack monitoring apparatus as claimed in claim 2, wherein the control unit is adapted to update and store the sensed discharging current data when the sensed discharging current is larger than an existing discharging current.

22. The battery pack monitoring apparatus as claimed in claim 2, wherein the control unit is adapted to update and store at least one switch temperature data when the temperature of the charging switch or the discharging switch is higher than an existing switch temperature.

* * * * *